(12) United States Patent
Hasebe et al.

(10) Patent No.: US 8,124,181 B2
(45) Date of Patent: *Feb. 28, 2012

(54) OXIDATION METHOD PROVIDING PARALLEL GAS FLOW OVER SUBSTRATES IN A SEMICONDUCTOR PROCESS

(75) Inventors: Kazuhide Hasebe, Nirasaki (JP); Takehiko Fujita, Nirasaki (JP); Shigeru Nakajima, Nirasaki (JP); Jun Ogawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 783 days.

This patent is subject to a terminal disclaimer.

(21) Appl. No.: 11/907,968

(22) Filed: Oct. 18, 2007

(65) Prior Publication Data

US 2008/0095678 A1 Apr. 24, 2008

(30) Foreign Application Priority Data

Oct. 20, 2006 (JP) .................................. 2006-286909

(51) Int. Cl.
*C23C 16/40* (2006.01)
(52) U.S. Cl. .......... 427/255.26; 427/255.27; 427/255.29
(58) Field of Classification Search ............. 427/255.26, 427/255.27, 255.29
See application file for complete search history.

(56) References Cited

U.S. PATENT DOCUMENTS

| | | | | |
|---|---|---|---|---|
| 6,221,791 B1 * | 4/2001 | Wang et al. | .................... | 438/773 |
| 7,125,811 B2 * | 10/2006 | Suzuki et al. | ................. | 438/773 |
| 7,129,186 B2 * | 10/2006 | Hasebe et al. | ................. | 438/766 |
| 7,220,461 B2 * | 5/2007 | Hasebe et al. | ................. | 427/533 |
| 7,452,826 B2 * | 11/2008 | Hasebe et al. | ................. | 438/766 |
| 7,605,095 B2 * | 10/2009 | Ikeuchi et al. | ................. | 438/787 |
| 7,611,995 B2 * | 11/2009 | Hasebe et al. | ................. | 438/723 |
| 7,696,106 B2 | 4/2010 | Okada et al. | | |
| 7,795,158 B2 * | 9/2010 | Fujita et al. | .................... | 438/770 |
| 2003/0068437 A1 * | 4/2003 | Nakamura et al. | ........ | 427/255.27 |
| 2003/0224618 A1 * | 12/2003 | Sato et al. | ...................... | 438/770 |

(Continued)

FOREIGN PATENT DOCUMENTS

CN 1762043 A * 4/2006

(Continued)

OTHER PUBLICATIONS

Qiu, T. et al., "Using oxygen and hydroxyl radicals for batch-furnace oxidation". Solid State Technology, Oct. 1, 2006, pp. 39-42.*
Qiu, T. et al., "Using oxygen and hydroxyl radicals for batch-furnace oxidation". Solid State Technology, Oct. 1, 2006, pp. 39-42. (Title and Date Only).*

(Continued)

*Primary Examiner* — Bret Chen
(74) *Attorney, Agent, or Firm* — Smith, Gambrell & Russell, LLP

(57) ABSTRACT

An oxidation method includes supplying oxidizing and deoxidizing gases to a process field by spouting the gases in lateral directions respectively from first and second groups of gas spouting holes. Each group of holes is disposed adjacent to target substrates on one side of the process field and arrayed over a length corresponding to the process field in a vertical direction. Gases are exhausted through an exhaust port disposed opposite to the first and second groups of gas spouting holes with the process field interposed therebetween and present over a length corresponding to the process field in the vertical direction. This causes the gases to flow along the surfaces of the target substrates, thus forming gas flows parallel with the target substrates. The process field is heated by a heater disposed around the process container to generate oxygen radicals and hydroxyl group radicals within the process field.

14 Claims, 8 Drawing Sheets

U.S. PATENT DOCUMENTS

| | | | |
|---|---|---|---|
| 2004/0194707 A1* | 10/2004 | Takahashi et al. | 118/722 |
| 2005/0164518 A1* | 7/2005 | Hasebe et al. | 438/766 |
| 2006/0276051 A1* | 12/2006 | Hasebe et al. | 438/766 |
| 2007/0157882 A1 | 7/2007 | Ozaki et al. | |
| 2009/0011609 A1* | 1/2009 | Ramkumar et al. | 438/763 |
| 2009/0081884 A1* | 3/2009 | Yokota et al. | 438/773 |

FOREIGN PATENT DOCUMENTS

| | | |
|---|---|---|
| CN | 101355022 A | 1/2009 |
| JP | 57-1232 | 1/1982 |
| JP | 3-140453 | 6/1991 |
| JP | 4-18727 | 1/1992 |
| JP | 2004-22833 | 1/2004 |
| JP | 2005-175441 | 6/2005 |
| JP | 2005-277386 | 10/2005 |

OTHER PUBLICATIONS

Bailey, Jeff, et al., "Derivation of Rate Constants for the Batch Furnace Radical Oxidation of Silicon Wafers via Hydrogen Combustion". Journal of the Electrochemical Society, 156 (5) H372-H377 (2009).*

Dudkin, V.A., "Oxidation of Hydrogen-Oxygen Mixtures under Isothermal Conditions near Self-Ignition Limits". Theoretical Foundations of Chemical Engineering, 2007, vol. 41, No. 3, pp. 264-272.*

Chinese Office Action issued Feb. 5, 2010 for Chinese Patent Application No. 200710194483.3 with partial English translation of office action.

Chinese Office Action issued on Jun. 29, 2011 for Application No. 200710194483.3 with English translation.

Chinese Office Action issued on Dec. 16, 2010 for Chinese Application No. 200710194483.3 w/ English translation.

* cited by examiner

OXIDATION METHOD PROVIDING PARALLEL GAS FLOW OVER SUBSTRATES IN A SEMICONDUCTOR PROCESS

BACKGROUND OF THE INVENTION

1. Field of the Invention

The present invention relates to an oxidation apparatus and method for a semiconductor process for oxidizing the surface of a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing semiconductor integrated circuits, a semiconductor substrate, such as a silicon wafer, is subjected to various processes, such as film formation, etching, oxidation, diffusion, and reformation, in general. For example, oxidation includes oxidation of the surface of a mono-crystalline silicon film or a poly-crystalline silicon film, and oxidation of a metal film. Particularly, a silicon oxide film formed by oxidation is applied to a device isolation film, gate oxide film, capacitor insulating film, or the like.

As regards methods for performing an oxidation process, where locking at them by the type of pressure, there is a normal-pressure oxidation method, in which the atmosphere inside a process container is set to be almost equal to atmospheric pressure. Further, there is a low-pressure oxidation method, in which the atmosphere inside a process container is set to be a vacuum. Where looking at them by the type of gas used for oxidation, there is a wet oxidation method, in which, for example, hydrogen and oxygen are burnt in an external combustion apparatus to generate water vapor, so as to perform oxidation by use of the water vapor (for example, Jpn. Pat. Appln. KOKAI Publication No. 3-140453 (Patent Document 1)). Further, there is a dry oxidation method, in which ozone or oxygen is solely supplied into a process container to perform oxidation without using water vapor (for example, Jpn. Pat. Appln. KOKAI Publication No. 57-1232 (Patent Document 2)).

As described above, oxidation can be performed by dry oxidation that employs oxygen gas, or wet oxidation that employs water vapor. In general, an oxide film formed by wet oxidation is higher in film quality than an oxide film formed by dry oxidation. Accordingly, in consideration of film properties, such as breakdown voltage, corrosion resistance, and reliability, a wet oxide film is better as an insulating film. On the other hand, the film formation rate of an oxide film (insulating film) to be formed and the planar uniformity therein on a wafer are also important factors. In this respect, a film formed by wet oxidation under a normal pressure shows a high oxidation rate, but shows poor planar uniformity in film thickness, in general. By contrast, a film formed by wet oxidation under a vacuum pressure shows a low oxidation rate, but shows good planar uniformity in film thickness.

Where the design rule of semiconductor devices or semiconductor integrated circuits is not so strict, various oxidation methods as those described above are selectively used, in consideration of, e.g., the intended purpose of oxide films, process conditions, and apparatus cost. On the other hand, in recent years, the line width and film thickness of semiconductor devices have decreased, and thus the design rule has become stricter. This tendency has given rise to demands on better planar uniformity in the quality and thickness of oxide films. However, conventional oxidation methods are now becoming inadequate in this regard, because they cannot sufficiently fulfill the demands.

Under the circumstances, there has been proposed an oxidation apparatus, in which $H_2$ gas and $O_2$ gas are independently supplied into a process container and are caused to react with each other inside the process container to generate water vapor, thereby oxidizing a wafer surface (for example, Jpn. Pat. Appln. KOKAI Publication No. 4-18727, Jpn. Pat. Appln. KOKAI Publication No. 2004-22833, Jpn. Pat. Appln. KOKAI Publication No. 2005-277386, and Jpn. Pat. Appln. KOKAI Publication No. 2005-175441 (Patent Documents 3, 4, 5, and 6)).

In the case of techniques disclosed in Patent Documents 3, 5, and 6, where an oxide film is formed, $H_2$ gas and $O_2$ gas are caused to react with each other under a low pressure of about 1 Torr and a relatively low temperature of, e.g., lower than 900° C. to generate oxygen radicals and hydroxyl group radicals. These radicals are used to oxidize a wafer surface, so as to form, e.g., a silicon oxide film.

BRIEF SUMMARY OF THE INVENTION

An object of the present invention is to provide an oxidation apparatus and method for a semiconductor process, which can simplify an operation for obtaining optimized process conditions, such as a gas flow rate.

According to a first aspect of the present invention, there is provided an oxidation apparatus for a semiconductor process comprising: a process container having a process field configured to accommodate c plurality of target substrates at intervals in a vertical direction; a gas supply system configure to supply an oxidizing gas and a deoxidizing gas to the process field through a gas supply port disposed adjacent to the target substrates on one side of the process field, the gas supply port comprising a plurality of gas spouting holes arrayed over a length corresponding to the process field in a vertical direction; a heater disposed around the process container and configured to heat the process field; an exhaust system configured to exhaust gas from the process field through an exhaust port disposed opposite to the gas supply port with the process field interposed therebetween; and a control section configured to control an operation of the apparatus, wherein the control section is preset to perform control such that the oxidizing gas and the deoxidizing gas are caused to react with each other, thereby generating oxygen radicals and hydroxyl group radicals within the process field, and an oxidation process is performed on the surfaces of the target substrate by use of the oxygen radicals and the hydroxyl group radicals.

According to a second aspect of the present invention, there is provided an oxidation method for a semiconductor process comprising: placing a plurality of target substrates at intervals in a vertical direction within a process field of a process container; supplying an oxidizing gas and a deoxidizing gas to the process field through a gas supply port disposed adjacent to the target substrates on one side of the process field, the gas supply port comprising a plurality of gas spouting holes arrayed over a length corresponding to the process field in a vertical direction; heating the process field by a heater disposed around the process container, thereby activating the oxidizing gas and the deoxidizing gas; exhausting gas from the process field through an exhaust port disposed opposite to the gas supply port with the process field interposed therebetween, thereby causing the oxidizing gas and the deoxidizing gas to flow along surfaces of the target substrates; causing the oxidizing gas and the deoxidizing gas to react with each other, thereby generating oxygen radicals and hydroxyl group radicals within the process field; and performing an oxidation process on the surfaces of the target substrate by use of the oxygen radicals and the hydroxyl group radicals.

According to a third aspect of the present invention, there is provided a computer readable medium containing program instructions for execution on a processor, wherein the program instructions, when executed by the processor, control an oxidation apparatus for a semiconductor process to conduct an oxidation method comprising: placing a plurality of target substrates at intervals in a vertical direction within a process field of a process container; supplying an oxidizing gas and a deoxidizing gas to the process field through a gas supply port disposed adjacent to the target substrates on one side of the process field, the gas supply port comprising a plurality of gas spouting holes arrayed over a length corresponding to the process field in a vertical direction; heating the process field by a heater disposed around the process container, thereby activating the oxidizing gas and the deoxidizing gas; exhausting gas from the process field through an exhaust port disposed opposite to the gas supply port with the process field interposed therebetween, thereby causing the oxidizing gas and the deoxidizing gas to flow along surfaces of the target substrates; causing the oxidizing gas and the deoxidizing gas to react with each other, thereby generating oxygen radicals and hydroxyl group radicals within the process field; and performing an oxidation process on the surfaces of the target substrate by use of the oxygen radicals and the hydroxyl group radicals.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
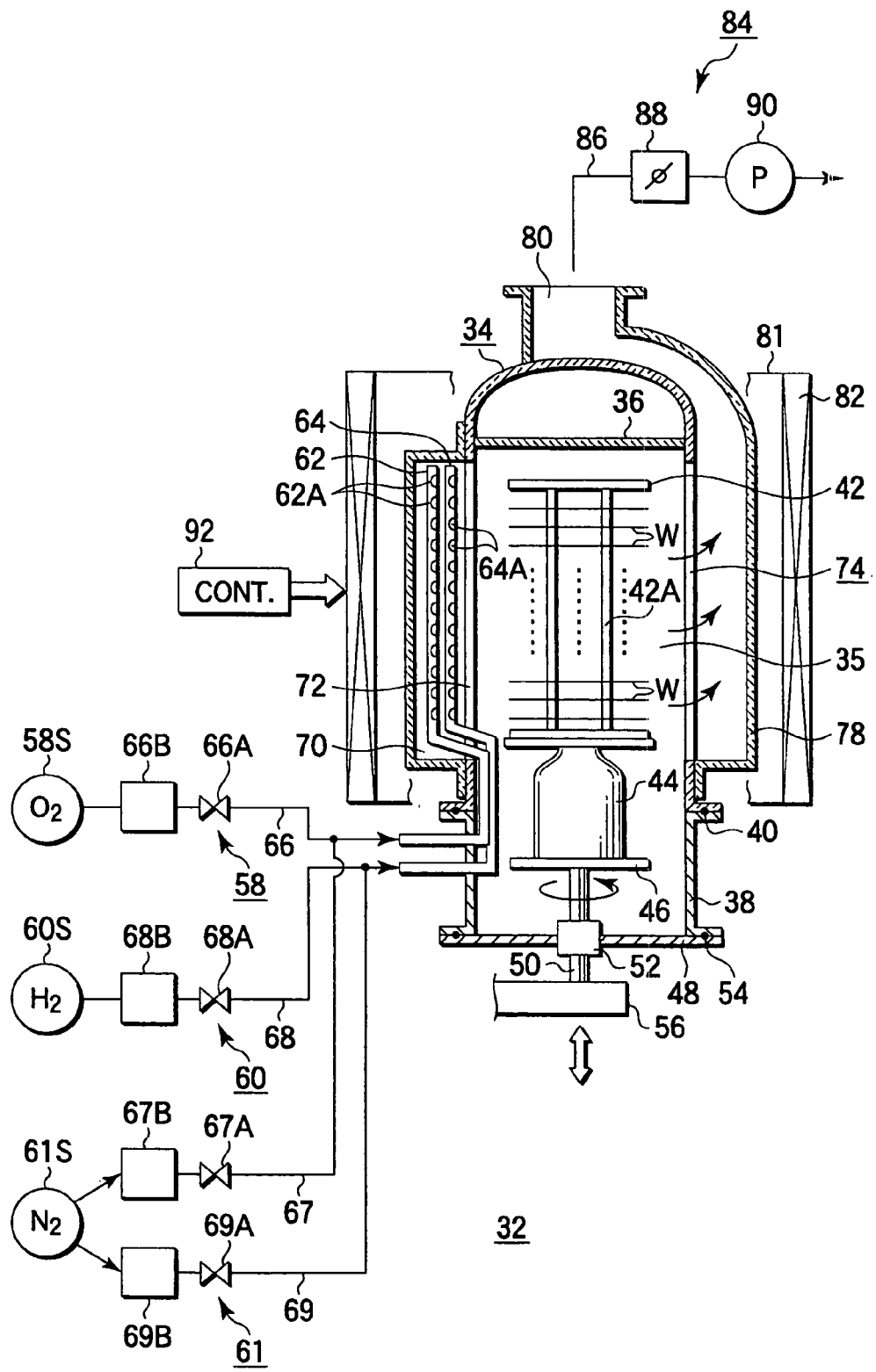
FIG. 1 is a sectional view showing a vertical heat processing apparatus (oxidation apparatus) according to an embodiment of the present invention.

In the process of developing the present invention, the inventors studied problems of conventional techniques for semiconductor processes, in relation to a method for forming an oxide film by oxidation. As a result, the inventors have arrived at the findings given below.

In an oxidation method for oxidizing a wafer surface by causing $H_2$ gas and $O_2$ gas to react without each other under a low pressure, various activated species (radicals) generated by reactions have very high reactivity. In this case, oxidation proceeds without reference to the orientation of crystal planes exposed on the wafer surface, i.e., without dependency on the orientation of crystal planes. Consequently, ever where ragged patterns are present on the wafer surface, an oxide film is formed with a uniform film thickness along the surface of ragged patterns. Further, since radicals are very reactive, a film difficult to oxidize, i.e., an oxidation resistant film, such as a silicon nitridation film, can be oxidized.

However, in spite of the advantages described above, the consumption of radicals significantly fluctuates depending on the pattern surface area and/or film type on a wafer surface to be oxidized. Accordingly, process conditions, such as gas flow rates, need to be optimized to compensate for the fluctuation. In this case, it is necessary to obtain optimized process conditions, such as gas flow rates, in advance in accordance the pattern surface area and/or film type. However, obtaining optimized process conditions, such as gas flow rates, requires adjustment operations that are very troublesome. Particularly, in recent years, the semiconductor industry has a trend of large item small volume production. This trend diversifies the pattern surface area and/or film type on a wafer surface, and thus requires a number of adjustment operations to optimize various conditions.

As a main reason as to why optimization of oxidation process conditions is very troublesome, this optimization requires complicate adjustment operations to attain good inter-substrate uniformity of a process (uniformity of the process between wafers in the vertical direction). Specifically, in the case of conventional apparatuses, the inter-substrate uniformity of processes is relatively poor as the apparatus property, and this poor uniformity is corrected by adjusting gas flow rates, process temperatures, and so forth for respective zones of the process field to attain good inter-substrate uniformity of processes. However, when one of the parameters of the process conditions thus obtained needs to be changed, some of the other parameters also need to be corrected for the respective zones, and bring about complicate adjustment operations. Accordingly, it is preferable to provide an apparatus property that can simplify optimization of process conditions, such as gas flow rates, even when one of the process conditions needs to be changed.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 2:
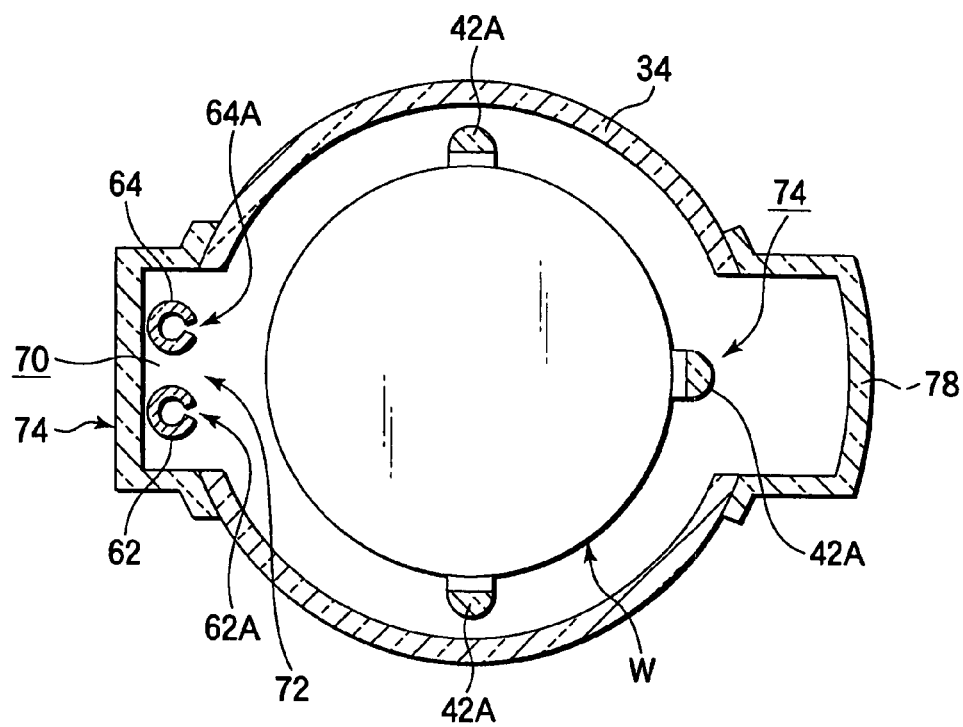
FIG. 2 is a sectional plan view showing part of the apparatus shown in FIG. 1.
Figure 3:
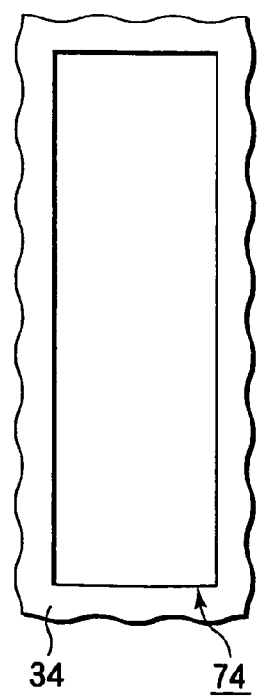
FIG. 3 is a front view showing an exhaust port of the apparatus shown in FIG. 1.

FIG. 1 is a sectional view showing a vertical heat processing apparatus (oxidation apparatus) according to an embodiment of the present invention. FIG. 2 is a sectional plan view showing part of the apparatus shown in FIG. 1. FIG. 3 is a front view showing an exhaust port of the apparatus shown in FIG. 1. The oxidation apparatus 32 has a process field configured to be selectively supplied with an oxidizing gas, such as $O_2$ gas, a deoxidizing gas, such as $H_2$ gas, and an inactive gas, such as $N_2$ gas. The oxidation apparatus 32 is configured to oxidize the surface of target substrates, such as semiconductor wafers, in the process field.

The oxidation apparatus 32 includes a process container (reaction chamber) 34 shaped as a cylindrical column with a ceiling and an opened bottom, in which a process field 35 is defined to accommodate and process a plurality of semiconductor wafers (target substrates) stacked at intervals. The entirety of the process container 34 is made of, e.g., quartz. The top of the process container 34 is provided with a quartz ceiling plate 36 to airtightly seal the top. The bottom of the process container 34 is connected through a seal member 40, such as an O-ring, to a cylindrical manifold 38. The process container may be entirely formed of a cylindrical quartz column without a manifold 38 separately formed.

The cylindrical manifold 38 is made of, e.g., stainless steel, and supports the bottom of the process container 34. A wafer boat 42 made of quartz is moved up and down through the bottom port of the manifold 38, so that the wafer boat 42 is loaded/unloaded into and from the process container 34. A number of target substrates or semiconductor wafers W are stacked on a wafer boat 42. For example, in this embodiment, the wafer boat 42 has struts 42A that can support, e.g., about 50 to 200 wafers having a diameter of 300 mm at essentially regular intervals in the vertical direction.

The wafer boat 42 is placed on a table 46 through a heat-insulating cylinder 44 made of quartz. The table 46 is supported by a rotary shaft 50 penetrating a lid 48, which is made of, e.g., stainless steel, and is used for opening/closing the bottom port of the manifold 38.

The portion of the lid 48 where the rotary shaft 50 penetrates is provided with, e.g., a magnetic-fluid seal 52, so that the rotary shaft 50 is rotatably supported in an airtightly sealed state. A seal member 54, such as an O-ring, is interposed between the periphery of the lid 48 and the bottom of the manifold 38, so that the interior of the process container 34 can be kept sealed.

The rotary shaft 50 is attached at the distal end of an arm 56 supported by an elevating mechanism 55, such as a boat elevator. The elevating mechanism 55 moves the wafer boat 42 and lid 48 up and down in unison. The table 46 may be fixed to the lid 48, so that wafers W are processed without rotation of the wafer boat 42.

A gas supply section is connected to the side of the manifold 38 to supply predetermined process gases to the process field 35 within the process container 34. Specifically, the gas supply section includes an oxidizing gas supply circuit 58, a deoxidizing gas supply circuit 60, and an inactive gas supply circuit 61. The oxidizing gas supply circuit 58 is arranged to supply an oxidizing gas, such as $O_2$ gas. In place of $O_2$ gas, ozone that is more reactive may be used. The deoxidizing gas supply circuit 60 is arranged to supply a deoxidizing gas, such as $H_2$ gas. The inactive gas supply circuit 61 is arranged to supply an inactive gas, such as $N_2$ gas, as a purge gas or an inactive gas for adjusting pressure. When used as a process gas, each of the oxidizing and deoxidizing gases may be mixed with a suitable amount of carrier gas (such as $N_2$ gas), as needed. However, such a carrier gas will not be mentioned, hereinafter, for the sake of simplicity of explanation.

More specifically, the oxidizing gas supply circuit 58 and deoxidizing gas supply circuit 60 include gas distribution nozzles 62 and 64, respectively, each of which is formed of a quartz pipe which penetrates the sidewall of the manifold 38 from the outside and then turns and extends upward (see FIG. 2). The gas distribution nozzles 62 and 64 respectively have a plurality of gas spouting holes 62A and 64A, each set being formed at predetermined intervals in the longitudinal direction (the vertical direction) over all the wafers W on the wafer boat 42.

The nozzle 62 is connected to gas sources 58S and 61S Of $O_2$ gas and $N_2$ gas through gas supply lines (gas passages) 66 and 67, respectively. The nozzle 64 is connected to gas sources 60S and 61S of $H_2$ gas and $N_2$ gas through gas supply lines (gas passages) 68 and 69, respectively. The gas supply lines 66, 67, 68, and 69 are provided with switching valves 66A, 67A, 68A, and 69A and flow rate controllers 66B, 67B, 68B, and 69B, such as mass flow controllers, respectively. With this arrangement, $O_2$ gas, $H_2$ gas, and $N_2$ gas can be supplied at controlled flow rates.

A nozzle reception recess 70 is formed at the sidewall of the process container 34 to extend in the vertical direction. The nozzle reception recess 70 has a vertically long and thin opening 72 formed by cutting a predetermined width of the sidewall of the process container 34 in the vertical direction. The opening 72 is covered with a quartz cover 73 airtightly connected to the outer surface of the process container 34. The cover 73 has a vertically long and thin shape with a concave cross-section, so that it projects outward from the process container 34.

Accordingly, the nozzle reception recess 70 is formed such that it projects outward from the sidewall of the process container 34 and is connected on the other side to the interior of the process container 34. In other words, the inner space of the nozzle reception recess 70 communicates through the opening 72 with the process field 35 within the process container 34. The opening 72 has a vertical length sufficient to cover all the wafers W on the wafer boat 42 in the vertical direction.

Both of the gas distribution nozzle 62 of the oxidizing gas and the gas distribution nozzle 64 of the deoxidizing gas are bent outward in the radial direction of the process container 34 at a position lower than the lowermost wafer W on the wafer boat 42. Then, the gas distribution nozzles 62 and 64 vertically extend side by side at the deepest position (the farthest position from the center of the process container 34) in the nozzle reception recess 70. The gas spouting holes 62A and 64A of the gas distribution nozzles 62 and 64 are formed at positions between the wafers W on the wafer boat 42 to respectively deliver the oxidizing gas ($O_2$) and the deoxidizing gas ($H_2$) essentially uniformly in the horizontal direction so as to form gas flows parallel with the wafers W. The oxidizing gas comprising $O_2$ gas and the deoxidizing gas comprising $H_2$ gas are spouted inward from the gas spouting holes 62A and 64A of the gas distribution nozzles 62 and 64, and are supplied through the opening 72 onto the wafers W on the wafer boat 42. When the inactive gas comprising $N_2$ gas is spouted from the gas distribution nozzles 62 and 64, this gas is supplied in the same manner to form gas flows parallel with the wafers W.

On the other hand, on the side of the process container 34 opposite to the nozzle reception recess 70, a long and thin exhaust port 74 for vacuum-exhausting the inner atmosphere is formed by cutting the sidewall of the process container 34. As shown in FIG. 3, exhaust port 74 has a vertical length sufficient to cover all the wafers W on the wafer boat 42 in the vertical direction. The exhaust port 74 is covered with an exhaust port cover member 78 made of quartz with a U-shape cross-section, and attached by welding. The exhaust port cover member 78 extends upward along the sidewall of the process container 34, and has a gas outlet 80 at the top of the process container 34. The gas outlet 80 is connected to a vacuum-exhaust system 84 including a vacuum pump and so forth. The vacuum exhaust system 84 has an exhaust passage 86 connected to the gas outlet 80, on which a valve unit (an opening degree adjustment valve) 88, a vacuum pump 90, and so forth are disposed in this order from the upstream side.

The process container 34 is surrounded by a casing 81. The casing 81 is provided with a heater 82 on the inner surface for heating the atmosphere and wafers W inside the process container 34. For example, the heater 82 is formed of a carbon wire, which causes no contamination and has good characteristics for increasing and decreasing the temperature. A thermocouple (not shown) is disposed near the exhaust port 74 in the process container 34 to control the heater 82.

The oxidation apparatus 32 further includes a main control section 92 formed of, e.g., a computer, to control the entire apparatus. The main control section 92 can control the oxidation process described below in accordance with the process recipe of the oxidation process concerning, e.g., the film thickness and composition of a film to be formed, stored in the memory thereof in advance. In the memory, the relationship between the process gas flow rates and the thickness and composition of the film is also stored as control data in advance. Accordingly, the main control section 92 can control the elevating mechanism 55, gas supply circuits 58, 60, and 61, exhaust system 84 (including the valve unit 88), heater 82, and so forth, based on the stored process recipe and control data.

Figure 12:
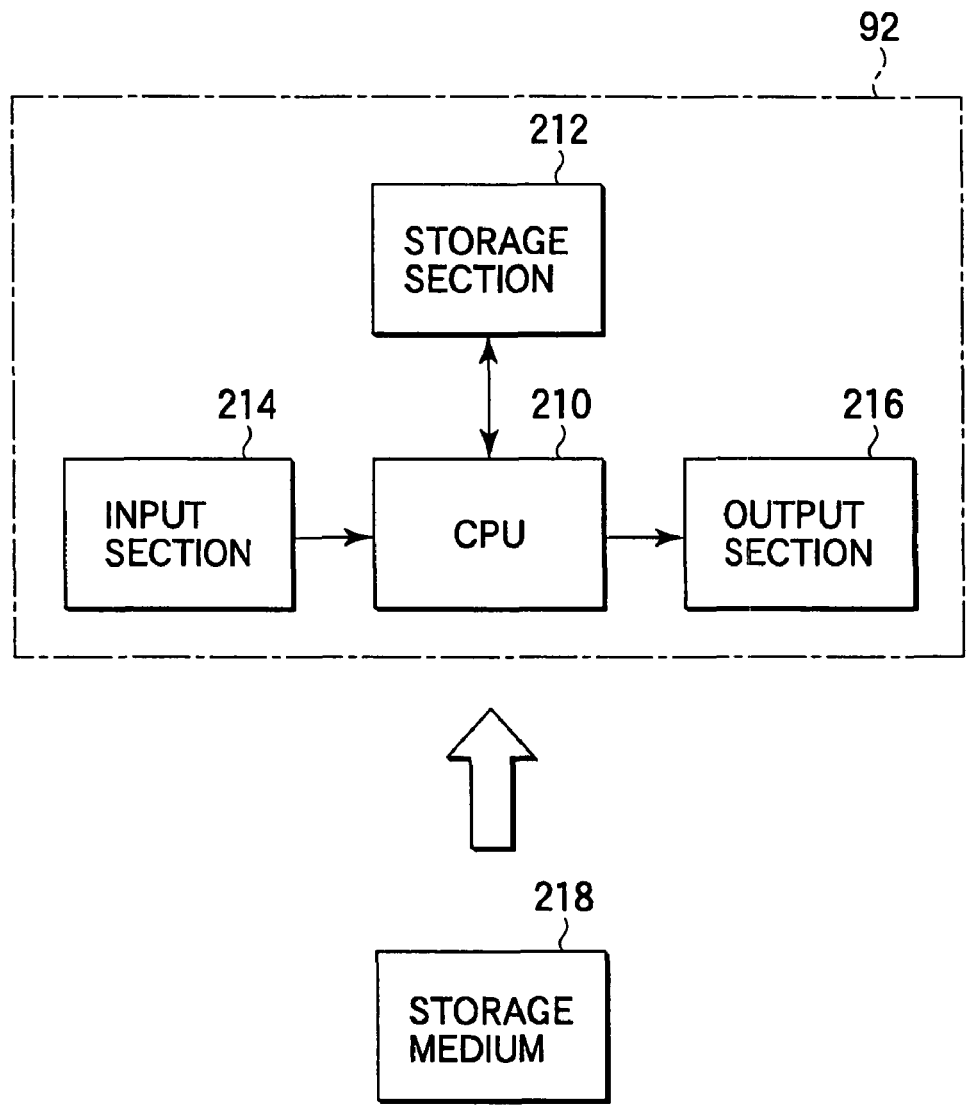
FIG. 12 is a block diagram schematically showing the structure of a main control section used in the apparatus shown in FIG. 1.

FIG. 12 is a block diagram schematically showing the structure of the main control section 92 of the apparatus shown in FIG. 1. The main control section 92 includes a CPU 210, which is connected to a storage section 212, an input section 214, and an output section 216. The storage section 212 stores process programs and process recipes. The input section 214 includes input devices, such as a keyboard, a pointing device, and a storage media drive, to interact with an operator. The output section 216 outputs control signals for controlling components of the processing apparatus. FIG. 12 also shows a storage medium 218 attached to the computer in a removable state.

The oxidation method described below may be written as program instructions for execution on a processor, into a computer readable storage medium or media to be applied to a semiconductor processing apparatus. Alternately, program instructions of this kind may be transmitted by a communication medium or media and thereby applied to a semiconductor processing apparatus. Examples of the storage medium or media are a magnetic disk (flexible disk, hard disk (a representative of which is a hard disk included in the storage section 212), etc.), an optical disk (CD, DVD, etc.), a magneto-optical disk (MO, etc.), and a semiconductor memory. A computer for controlling the operation of the semiconductor processing apparatus reads program instructions stored in the storage medium or media, and executes them on a processor, thereby performing a corresponding method, as described below.

Next, an explanation will be given of an oxidation method performed in the apparatus shown in FIG. 1. In summary, this oxidation method is arranged to supply an oxidizing gas comprising $O_2$ gas and a deoxidizing gas comprising $H_2$ gas to the process field 35 accommodating wafers W, while exhausting gas from the process field 35. When the oxidizing gas and deoxidizing gas are supplied into the process field 35, they are activated by heat applied from the heater 82. Consequently, the oxidizing gas and deoxidizing gas are caused to react with each other to generate oxygen radicals and hydroxyl group radicals inside the process field 35, thereby performing an oxidation process on the surface of the wafers W.

When the oxidation apparatus 32 is set in standby with no semiconductor wafers W loaded therein, the process field 35 is maintained at a temperature lower than the process temperature. When the process is started, at first, the wafer boat 42 set at room temperature, which supports a number of, e.g., 50 to 200, wafers having a diameter of 300 mm, is loaded into the process container 34 heated at a predetermined temperature. The wafers are formed of, e.g., silicon substrates with a silicon or silicon oxide film exposed all over or partly on the surface, as an oxidation target, (the wafers may have an exposed metal film or nitride film, depending on the process). Then, the interior of the process container 34 is vacuum-exhausted and kept at a predetermined process pressure, and the wafer temperature is increased to a process temperature for oxidation. The apparatus is in a waiting state until the temperature becomes stable. Then, the oxidizing gas comprising $O_2$ gas and the deoxidizing gas comprising $H_2$ gas are supplied from the gas distribution nozzles 62 and 64 at controlled flow rates. At this time, while the wafer boat 42 is rotated, silicon on the surface of the wafers W supported on the wafer boat 42 is oxidized to form a silicon oxide film ($SiO_2$).

The oxidizing gas comprising $O_2$ gas is supplied from the gas spouting holes 62A of the gas distribution nozzle 62. The deoxidizing gas comprising $H_2$ gas is supplied from the gas spouting holes 64A of the gas distribution nozzle 64. While these gases are supplied, the process field 35 is exhausted through the vertically long exhaust port 74 on the side of the process container 34 opposite to the gas spouting holes 62A and 64A. Consequently, gas flows of the oxidizing gas and deoxidizing gas are formed in parallel with the wafers W on the wafer boat 42. The $O_2$ gas and $H_2$ gas supplied into the process container 34 are activated by heat applied from the heater 82 and cause a combustion reaction while diffusing in the process container 34. In the process of this reaction, oxygen radicals ($O^*$), hydroxyl group radicals ($OH^*$), and water vapor ($H_2O$) are generated (the symbol [*] denotes that it is a radical), by which silicon on the wafer surface is oxidized to form a silicon oxide film.

In the conventional apparatus, while gas flows from an upstream side to a downstream side inside the process field, radicals are gradually consumed for performing oxidation. In this case, depending on the pattern shape (surface area) and film type on the wafer surface, the consumption of radicals tends to significantly fluctuate. Consequently, in order to maintain high reproducibility in film thickness, very complicate adjustment operations need to be performed in advance, so that optimized process conditions, such as gas flow rates, are obtained in accordance with the pattern surface area and/or film type on the wafer surface.

However, as described above, the method according to this embodiment is arranged to heat the oxidizing gas and deoxidizing gas by the heater 82 while forming gas flows of the gases in parallel with the wafers W, thereby causing a combustion reaction. In this case, a large number of radicals can be supplied onto the wafers W, and the relative value of the fluctuation rate of radicals is thereby decreased. Consequently, even where the pattern surface area and/or film type on the wafer surface are changed as described above, adjustment operations for process conditions become less necessitated. In other words, it is possible to simplify adjustment operations in obtaining optimized process conditions, such as gas flow rates.

The oxidation process described above may be performed under the following process conditions, although these conditions are not limiting. Specifically, the process temperature is set to be 450 to 1,100° C., and preferably to be 450 to 750° C. in light of the heat resistance of underlying devices. If the process temperature is lower than 450° C., the activated species (radicals) described above cannot be sufficiently generated. If the process temperature is higher than 1,100° C., it exceeds the heat-resistant temperature of the process container 34 and/or wafer boat 42, and jeopardizes the safety of the process. The process pressure is set to be 50 mTorr to 20 Torr (1 Torr=133 Pa), typically, to be less than 5 Torr, preferably to be less than 3.5 Torr, and more preferably to be less than 1 Torr, such as 0.35 Torr. If the process pressure is higher than 20 Torr, the radicals described above cannot be sufficiently generated.

The flow rate of $O_2$ gas is set to be within a range of 10 to 30,000 sccm. The flow rate of $H_2$ gas is set to be within a range of 1 to 100,000 sccm, and more preferably of 500 to 10,000 sccm. However, the gas flow rates depend on the size of the process container 34. The process time depends on the thickness of an oxide film to be formed.

<Experiment 1: Film Formation Rate (Film Thickness)>

As regards an oxidation apparatus according to the embodiment described above, the relationship between the hydrogen concentration and the film formation rate (film thickness) was examined. In a present example PE1, an oxidation process was performed by a method according to the embodiment described above using $O_2$ gas and $H_2$ gas in the apparatus shown in FIG. 1. As the process conditions of the present example PE1, the process temperature was set at 750° C., process pressure at 0.35 Torr, $O_2$ gas flow rate at 2 slm (standard liter per minute) (fixed), $H_2$ gas flow rate at different values (parameter), and process time at 30 minutes. In a comparative example CE1, an oxidation process was performed by use of a vertical heat processing apparatus arranged to supply $O_2$ gas and $H_2$ gas from below the process field and to exhaust them from the top. As the process conditions of the comparative example CE1, the process temperature was set at 850° C., process pressure at 0.4 Torr, "$O_2+H_2$" gas flow rate at 2.7 slm (fixed) (using $H_2$ gas flow rate as a parameter), and process time at 30 minutes.

Figure 4:
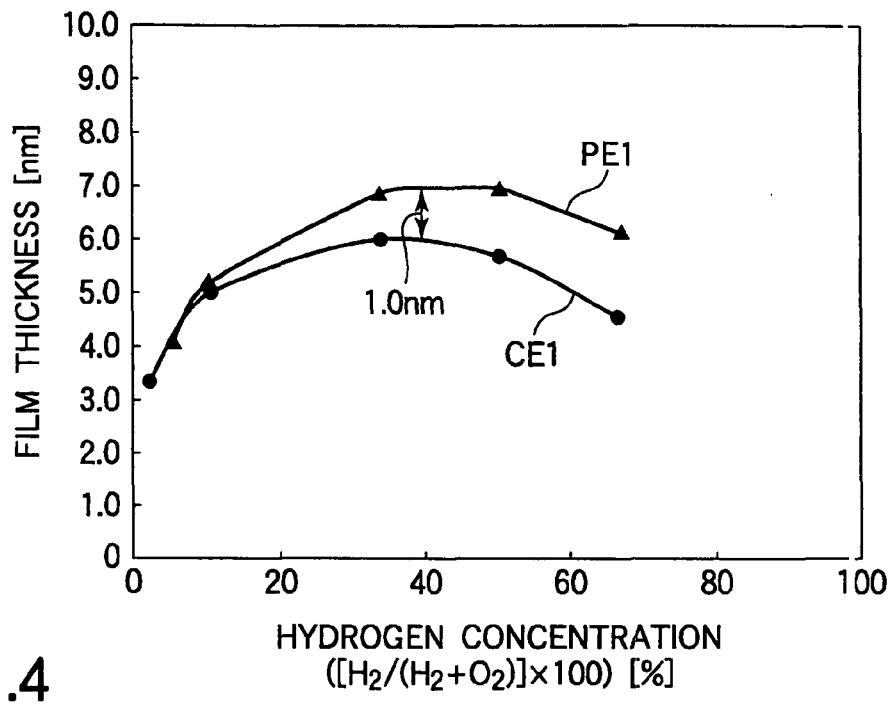
FIG. 4 is a graph showing the relationship between the hydrogen concentration and the film formation rate (film thickness), in a present example PE1 and a comparative example CE1.

FIG. 4 is a graph showing the relationship between the hydrogen concentration ($[H_2/(H_2+O_2)]\times 100$) [%] and the film formation rate (film thickness), in the present example PE1 and comparative example CE1. As shown in FIG. 4, in both of the present example PE1 and comparative example CE1, the film thickness (film formation rate) increased with an increase in the hydrogen concentration from zero, took on a peak at a hydrogen concentration of 30 to 45%, and then gradually decreased. However, near the peak values of the film thickness, the film thickness of the present example PE1 was larger than that of the comparative example CE1 by about 1 nm. Further, the film formation rate of the present example PE1 was larger than that of the comparative example CE1, although the process temperature of the present example PE1 was lower than that of the comparative example CE1 by about 100° C. Accordingly, it has been confirmed that the apparatus according to the embodiment described above improves the film formation rate as compared to the conventional apparatus.

<Experiment 2: Planar Uniformity of Film Thickness>

As regards an oxidation apparatus according to the embodiment described above, the relationship between the process pressure and the planar uniformity of film thickness was examined. In a present example PE2, an oxidation process was performed by a method according to the embodiment described above using $O_2$ gas and $H_2$ gas in the apparatus shown in FIG. 1. As the process conditions of the present example PE2, the process temperature was set at 750° C., process pressure at different values (parameter), $O_2$ gas flow rate at 2 slm, $H_2$ gas flow rate at 1 slm, and process time at 30 minutes. In a comparative example CE2, as in the experiment 1, an oxidation process was performed by use of a vertical heat processing apparatus arranged to supply $O_2$ gas and $H_2$ gas from below the process field and to exhaust them from the top. As the process conditions of the comparative example CE2, the process temperature was set at 900° C., process pressure at different values (parameter), $O_2$ gas flow rate at 1.8 slm, $H_2$ gas flow rate at 0.9 slm, and process time at 30 minutes.

Figure 5:
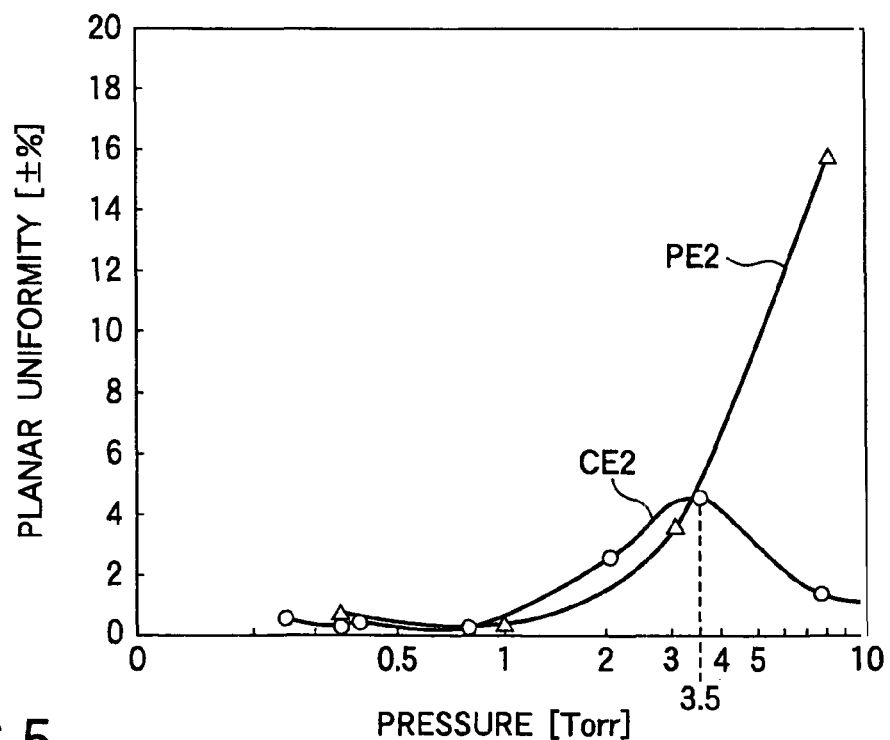
FIG. 5 is a graph showing the relationship between the process pressure and the planar uniformity of oxide film thickness, in a present example PE2 and a comparative example CE2.

FIG. 5 is a graph showing the relationship between the process pressure and the planar uniformity of oxide film thickness, in the present example PE2 and comparative example CE2. As shown in FIG. 5, in the comparative example CE2, the planar uniformity of film thickness increased or deteriorated with an increase in the process pressure, took on a peak at a process pressure of about 3.5 Torr, and then gradually decreased or improved. On the other hand, in the present example PE2, the planar uniformity of film thickness was good until a process pressure of about 3.5 Torr, in which the planar uniformity was almost the same as or lower than that of the comparative example CE2, and then rapidly increased or deteriorated with an increase in the process pressure. Accordingly, it has been confirmed that the apparatus according to the embodiment described above improves the planar uniformity of film thickness where the process pressure is set to be not more than 3.5 Torr (466 Pa).

<Experiment 3: Loading Effect>

As regards an oxidation apparatus according to the embodiment described above, it was examined in terms of a loading effect. The loading effect is a phenomenon in which radical consumption fluctuates depending on the wafer surface area and so forth and affects the film formation rate (film thickness). The consumption of radicals significantly fluctuates depending on the wafer surface area (the surface area varies due to projected and recessed portions formed on the surface) and the material type of the wafer surface. For example, where the wafer surface has a large surface area due to projected and recessed portions or the wafer surface has a surface that can be easily oxidized, such as a silicon or metal surface, exposed thereon, the radical consumption is large. In reverse, where the wafer surface area is small, or the wafer surface is covered with an oxidation resistant film, such as a silicon oxide film or silicon nitride film, the radical consumption is small.

In present examples PE3 and PE4, an oxidation process was performed by a method according to the embodiment described above using $O_2$ gas and $H_2$ gas in the apparatus shown in FIG. 1. As the process conditions of the present examples PE3 and PE4, the process temperature was set at 750° C., process pressure at 0.35 Torr, O$_2$ gas flow rate at 2 slm, H$_2$ gas flow rate at 0.222 slm, and process time at 30 minutes. In comparative examples CE3 and CE4, as in the experiment 1, an oxidation process was performed by use of a vertical heat processing apparatus arranged to supply O$_2$ gas and H$_2$ gas from below the process field and to exhaust them from the top. As the process conditions of the comparative examples CE3 and CE4, the process temperature was set at 725° C., process pressure at 0.35 Torr, O$_2$ gas flow rate at 4.05 slm, H$_2$ gas flow rate at 0.45 slm, and process time at 30 minutes.

In the present examples PE3 and PE4 and comparative examples CE3 and CE4, monitor wafers consisting of bare silicon wafers (silicon is exposed on the surface) were placed on five positions on the wafer boat 42. The positions of the monitor wafers were set at TOP (top), T-C (top center), CTR (center), B-C (bottom center), and BTM (bottom) in this order from the top, which correspond to five zones of the wafer boat 42 arrayed in the vertical direction. In the present example PE3 and comparative example CE3, wafers covered with an SiO$_2$ film were placed at the other positions of the wafer boat 42 around the monitor wafers. In the present example PE4 and comparative example CE4, bare silicon wafers were placed at the other positions of the wafer boat 42 around the monitor wafers.

Figure 6:
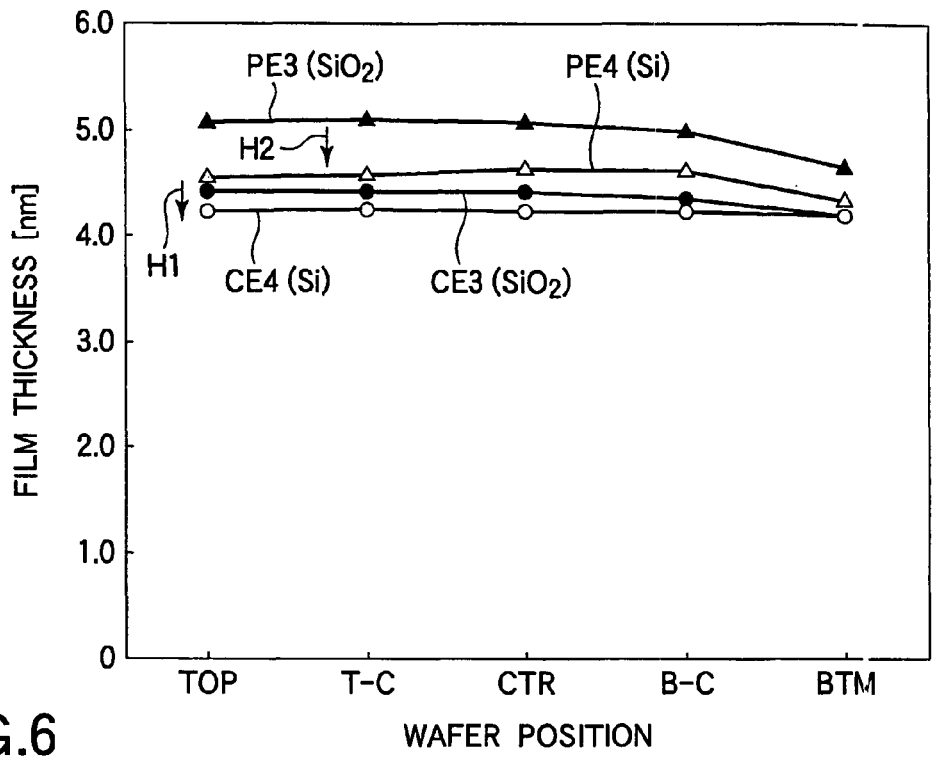
FIG. 6 is a graph showing the relationship between the wafer position and the oxide film thickness, in present examples PE3 and PE4 and comparative examples CE3 and CE4.

FIG. 6 is a graph showing the relationship between the wafer position and the oxide film thickness, in the present examples PE3 and PE4 and comparative examples CE3 and CE4. It should be noted that the important point of FIG. 6 resides in whether or not the loading effect uniformly appears in the vertical direction of the wafer boat 42.

In the comparative examples CE3 and CE4, the film thickness difference between the two characteristic lines was almost zero at the positions BTM and B-C, but it became gradually larger toward the position TOP at which a film thickness difference of H1 appeared. In this case, every time the wafer surface area and/or surface material type are changed, it is necessary to perform complicate adjustment operations, e.g., to adjust gas flow rates or the like to a considerable degree, so as to attain good inter-substrate uniformity of the film thickness on the wafers.

On the other hand, in the present examples PE3 and PE4, the two characteristic lines rendered changes while maintaining a near parallel state with a film thickness difference of H2. In this case, even where the wafer surface area and/or surface material type are changed, the film thickness on the wafers becomes uniformly smaller or larger in the inter-substrate direction. In other words, the loading effect essentially uniformly appears over the longitudinal direction of the wafer boat. Accordingly, unlike the comparative examples CE3 and CE4, it becomes unnecessary or less necessary to perform complicate adjustment operations for, e.g., gas flow rates, so as to attain good inter-substrate uniformity of the film thickness on the wafers.

Figure 7:
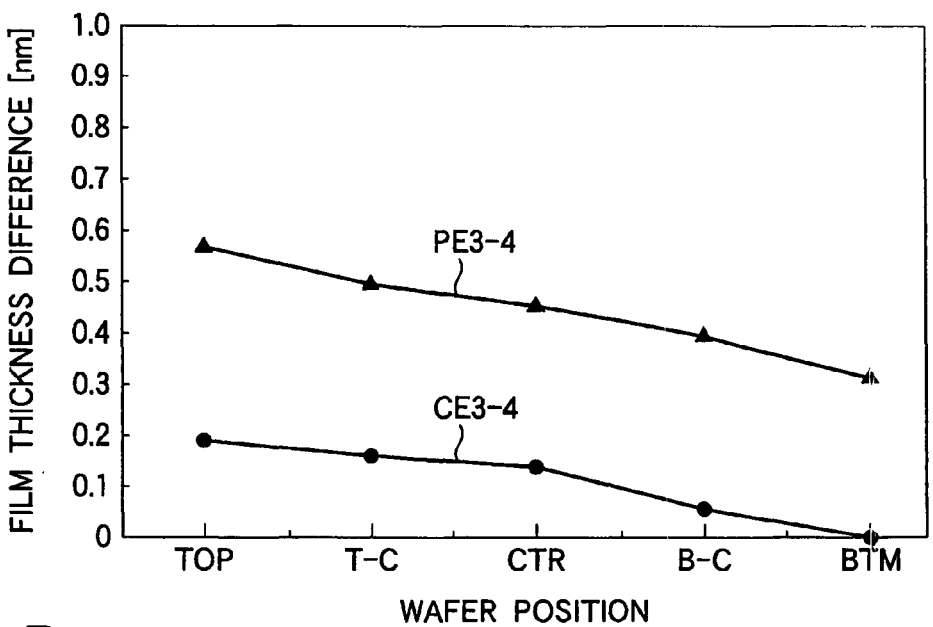
FIG. 7 is a graph showing variations in film thickness difference due to a loading effect, obtained from the graph shown in FIG. 6.

FIG. 7 is a graph showing variations in film thickness difference due to a loading effect, obtained from the graph shown in FIG. 6. In FIG. 7, a line CE3-4 denotes a characteristic of [the value of the comparative example CE3]−[the value of the comparative example CE4]. A line PE3-4 denotes a characteristic of [the value of the present example PE3]− [the value of the present example PE4]. AE shown in FIG. 7, both of the lines CE3-4 and PE3-4 inclined upward, i.e., the film thickness difference (decreased amount) became larger, from the position BTM to the position TOP.

Figure 8:
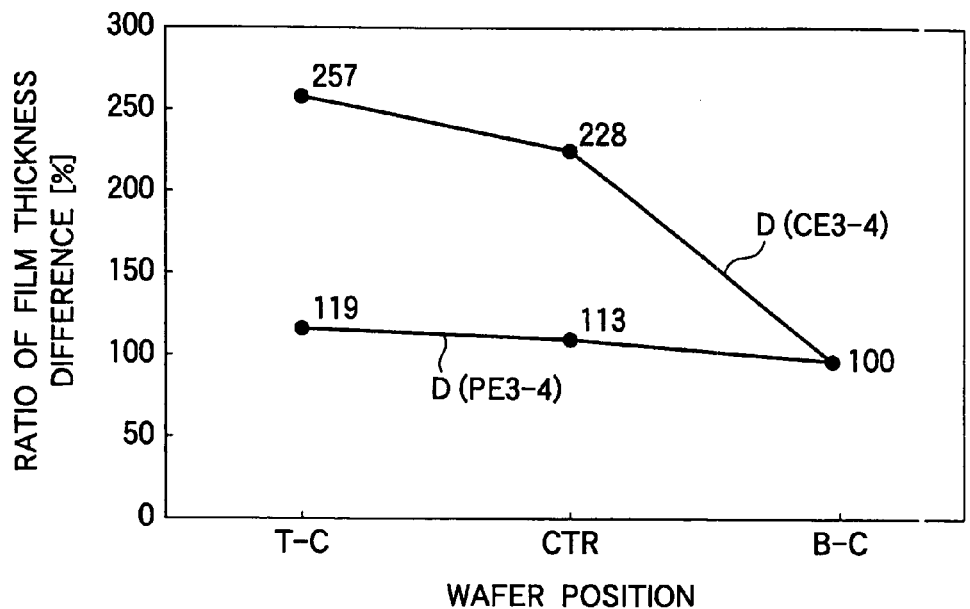
FIG. 8 is a graph showing ratios of film thickness difference at respective positions relative to a film thickness difference at a position B-C, obtained from the graph shown in FIG. 7.

FIG. 8 is a graph showing ratios of film thickness difference at respective positions relative to a film thickness difference at the position B-C, obtained from the graph shown in FIG. 7. In FIG. 8, the positions BTM and TOP are omitted. In FIG. 8, a line D(CE3-1) corresponds to the comparative examples CE3 and CE1, and a line D(PE3-4) corresponds to the present examples PE3 and PE4.

As show in FIG. 8, in the line D(CE3-4) according to the comparative examples, the ratio of the film thickness difference increased from the position B-C to the position T-C at which it reached a very large ratio of 257%. This means that it is necessary to perform complicate adjustment operations, e.g., to adjust gas flow rates or the like to a considerable degree, as described above.

On the other hand, in the line D(PE3-4) according to the present examples, the ratio of the film thickness difference slightly increased from the position B-C to the position T-C at which it reached a very small ratio of 119%. This means it becomes unnecessary or less necessary to perform complicate adjustment operations for, e.g., gas flow rates, as described above.

<Modification of Exhaust Port>

Figures 9A, 9B, 9C:
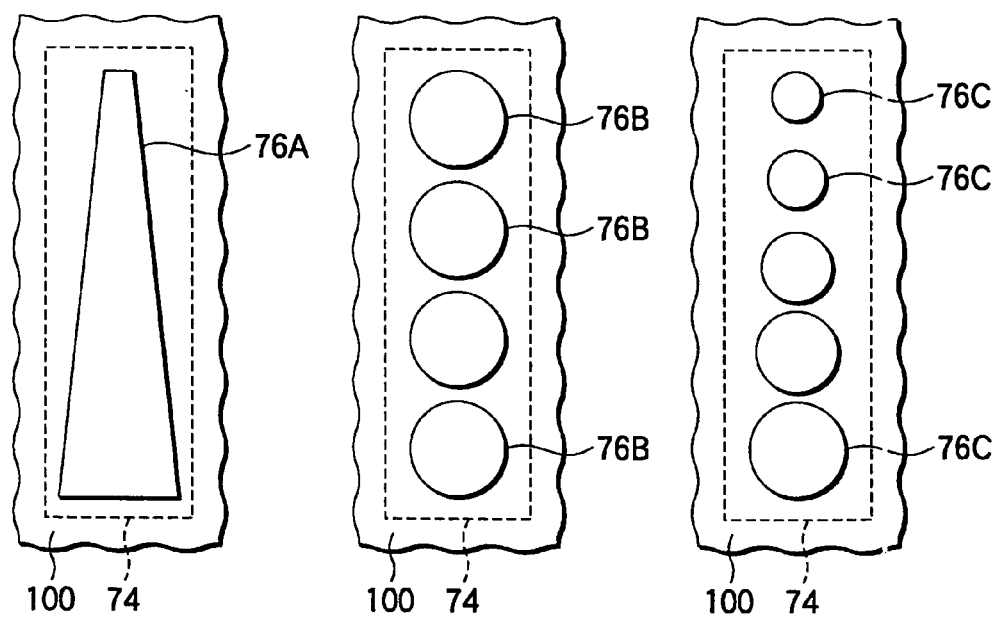
FIGS. 9A to 9C are views respectively showing modifications of the shape of an exhaust port forged in the process container.

FIGS. 9A to 9C are views respectively showing modifications of the shape of the exhaust port formed in the process container. In the modification shown in FIG. 9A, the opening of the exhaust port 74 is covered with an exhaust plate 100 made of, e.g., quartz, and a vertical long exhaust port 76A is formed in the exhaust plate 100 such that the opening width changes in the longitudinal direction. In this case, the width of the exhaust port 76A gradually decreases toward the downstream side of the exhaust gas flow direction (the upper side in FIG. 9A). With this arrangement, gas flows formed in the horizontal direction between the wafers are uniformized in the vertical direction of the wafer boat 42.

In the modification shown in FIG. 9B, the opening of the exhaust port 74 is covered with an exhaust plate 100, and a plurality of (four) circular exhaust ports 76B having the same area are formed and arrayed in the exhaust plate 100. In the modification shown in FIG. 9C, the opening of the exhaust port 74 is covered with an exhaust plate 100, and a plurality of (five) circular exhaust ports 76C having different areas are formed and arrayed in the exhaust plate 100. In this case, the opening areas of the exhaust ports 76C gradually decrease toward the downstream side of the exhaust gas flow direction (the upper side in FIG. 9C). With this arrangement, gas flows formed in the horizontal direction between the wafers are uniformized in the vertical direction of the wafer boat 42.

<Modification of Gas Nozzles>

Figure 10A:
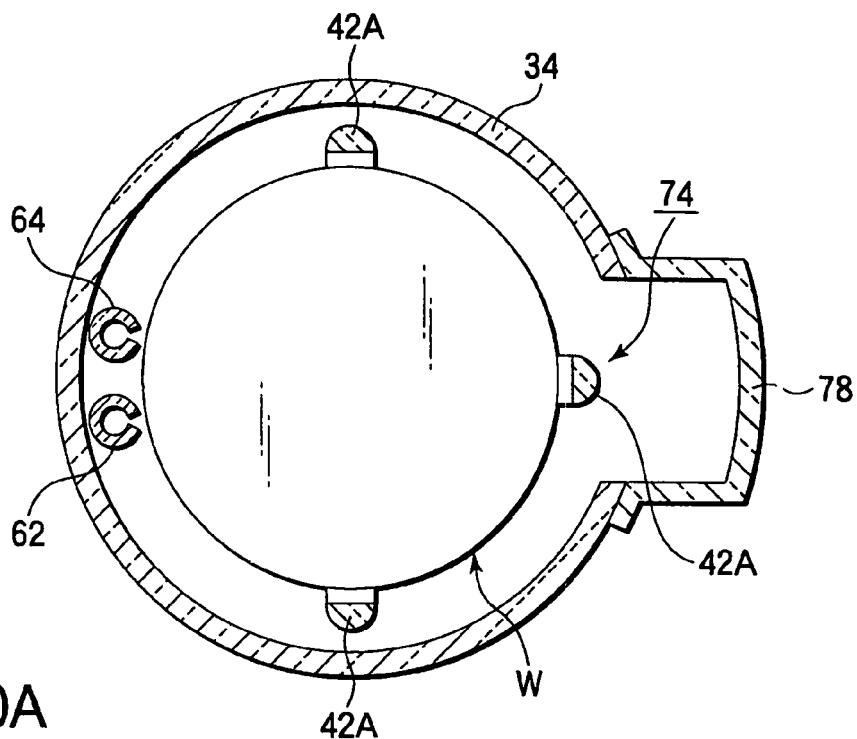
FIGS. 10A and 10B are sectional views respectively showing modifications of the position of gas nozzles.
Figure 10B:
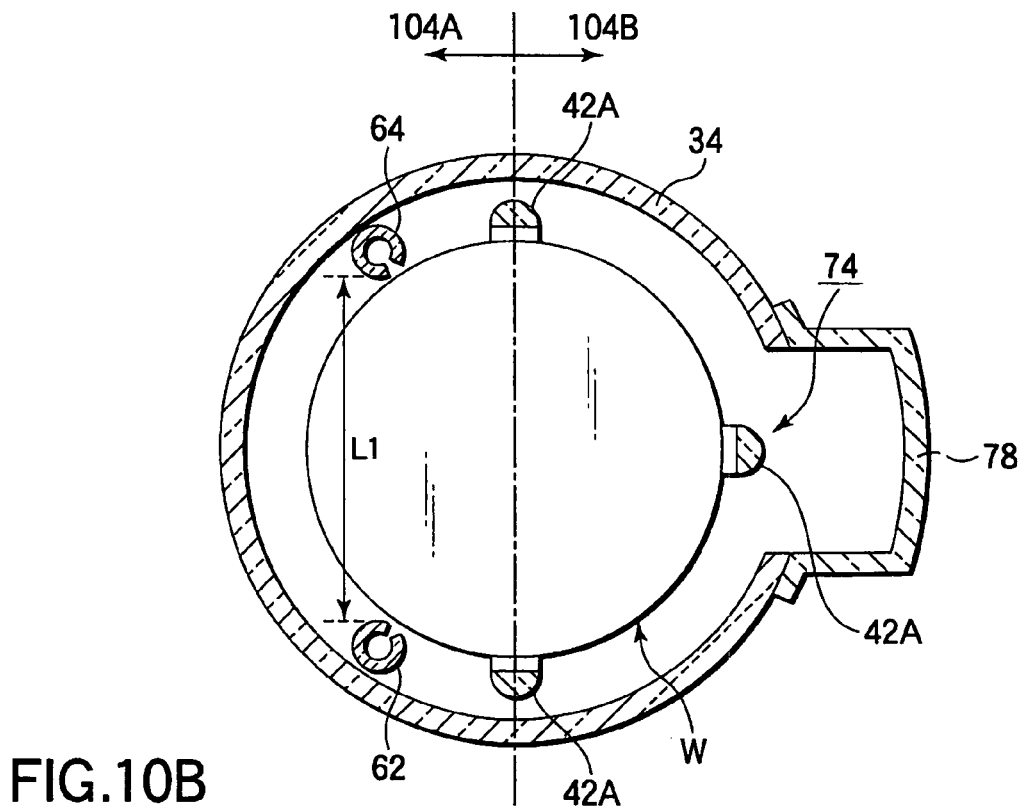

FIGS. 10A and 10B are sectional views respectively showing modifications of the position of the gas nozzles. In the modification shown in FIG. 10A, the two gas nozzles 62 and 64 are disposed side by side in a space between the container sidewall and wafer periphery without forming the nozzle reception recess 70 described above (see FIG. 2). This arrangement is effective where a sufficient space is present between the sidewall of the process container 34 and the peripheral edges of the wafers W.

In the modification shown in FIG. 10B, the two gas nozzles 62 and 64 are separated by a certain distance L1 larger than the width of the exhaust port 74. In this case, the gas nozzles 62 and 64 are located in one semicircular portion 104A of the process container 34 and the exhaust port 74 is located in the other semicircular portion 104B. In this case, the exhaust port 74 is preferably formed on a bisector line perpendicularly crossing the center of a line connecting the gas nozzles 62 and 64.

In general, near the gas spouting holes 62A and 64A of the gas nozzles 62 and 64, the concentration of the spouted gases is high, and generation of radicals of the gases tends to be thereby suppressed. In this respect, where the gas nozzles 62 and 64 are disposed side by side, as shown in FIG. 10A, the effects of suppressing radical generation may act by way of synergy and affect the film thickness. On the other hand, where the gas nozzles 62 and 64 are separate by the distance L1 with which they do not affect each other, the synergistic ill effect described above is suppressed.

Figure 11A:
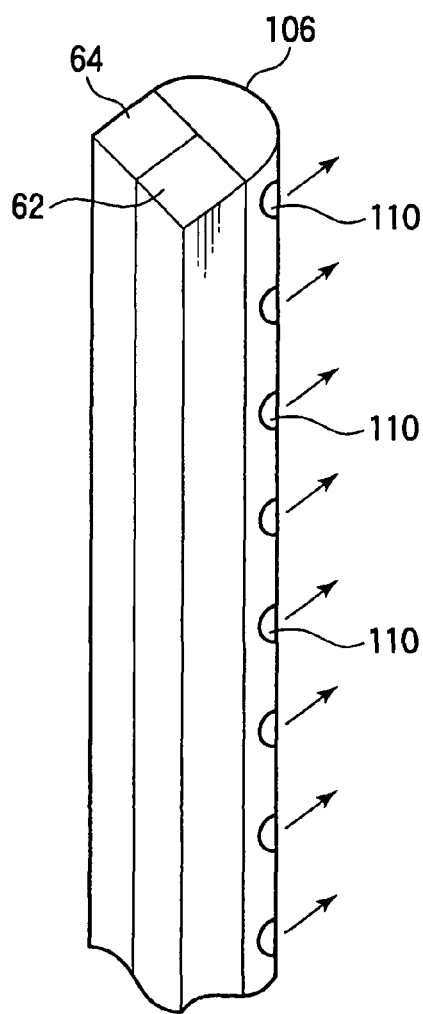
FIGS. 11A and 11B are a schematic perspective view and a sectional view, respectively, showing another modification of gas nozzles.
Figure 11B:
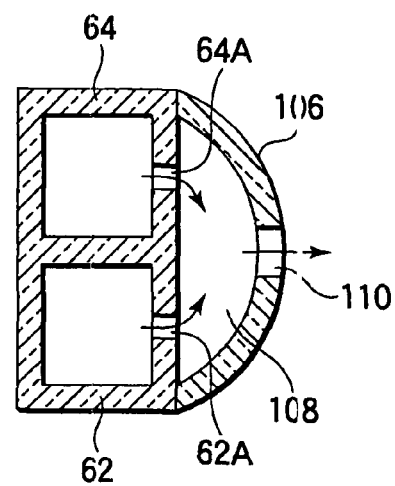

FIGS. 11A and 11B are a schematic perspective view and a sectional view, respectively, showing another modification of gas nozzles. In the modification shown in FIGS. 11A and 11B, the two gas nozzles 62 and 61 are joined and integrated with each other. In this example, the gas nozzles 62 and 64 have rectangular cross sections, but may have other shapes, such as circular shapes. A semicircular cover wall 106 made of quartz is attached to the gas nozzles 62 and 64 by welding on the gas spouting side of the gas spouting holes 62A and 64A, so that gas mixing chamber 108 is formed on this side. The cover wall 106 has a plurality of gas spouting holes 110 formed therein and arrayed in the longitudinal direction (vertical direction). The gas spouting holes 110 are formed at positions between the wafers W on the wafer boat 42 to deliver the gas essentially uniformly in the horizontal direction, so as to form gas flows parallel with the wafers W.

The $O_2$ gas and $H_2$ gas spouted from the gas spouting holes 62A and 64A of the gas nozzles 62 and 64 are mixed inside the gas mixing chamber 108, and when spouted from the gas spouting holds 110 toward the wafers W. In this case, mixing of the $O_2$ gas and $H_2$ gas is promoted, and the reaction therebetween is accelerated by that much. Accordingly, an oxidation process can be performed at a lower process temperature, such as about 400° C.

<Other Modifications>

In the embodiment described above, the oxidizing gas is $O_2$ gas while the deoxidizing gas is $H_2$ gas, but this is not limiting. The oxidizing gas may be one or more gases selected from the group consisting of $O_2$, $O_3$, and $N_xO_y$ (x and y are integers). The $N_xO_y$ includes NO, $N_2O$, and $NO_2$. The deoxidizing gas may be one or more gases selected from the group consisting of $H_2$, $NH_3$, $CH_4$, HCl, D (deuterium), $D_2$, $ND_3$, $CD_4$, and DCl.

The embodiment described above is exemplified by a case where silicon is exposed on the surface of semiconductor wafers. Alternatively, the present invention may be applied to a case where oxidation is performed on a silicon oxide film, silicon nitridation film, metal film, metal oxide film, or metal nitridation film exposed on the surface. Where a silicon oxide film is present on the surface, the thickness of the silicon oxide film is increased by the oxidation.

The embodiment described above is exemplified by an oxidation apparatus of the batch type to process a plurality of wafers together at a time. Alternatively, the present invention may be applied to an oxidation apparatus of a single-wafer type to process wafers one by one.

The embodiment described above is exemplifies by a case where the target substrate is a semiconductor wafer. Alternatively, the present invention may be applied to a glass substrate, LCD substrate, or ceramic substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An oxidation method for a semiconductor process for oxidizing surfaces of a plurality of target substrates, the method comprising:
   placing the target substrates at intervals in a vertical direction within a process field of a process container;
   supplying an oxidizing gas and a deoxidizing gas to the process field by spouting the oxidizing gas and the deoxidizing gas only in lateral directions respectively from a first group of gas spouting holes and a second group of gas spouting holes, each group of which is disposed adjacent to the target substrates on one side of the process field and arrayed over a length corresponding to the process field in a vertical direction, while exhausting gas through an exhaust port disposed opposite to the first and second groups of gas spouting holes with the process field interposed therebetween and present over a length corresponding to the process field in the vertical direction, to cause the oxidizing gas and the deoxidizing gas spouted from the first and second groups of gas spouting holes to flow uniformly along the surfaces of the target substrates into the exhaust port, while forming gas flows parallel with the target substrates; and
   heating the process field by a heater disposed around the process container to activate the oxidizing gas and the deoxidizing gas to cause the oxidizing gas and the deoxidizing gas to react with each other so as to generate oxygen radicals and hydroxyl group radicals within the process field while performing an oxidation process on the surfaces of the target substrates by use of the oxygen radicals and the hydroxyl group radicals.

2. The method according to claim 1, wherein the surfaces of the target substrate include a silicon layer to be oxidized in the oxidation process.

3. The method according to claim 1, wherein the oxidation process is performed by use of a process pressure of 50 mTorr to 20 Torr.

4. The method according to claim 1, wherein the oxidation process is performed by use of a process temperature of 400 to 1,100° C.

5. The method according to claim 1, wherein the oxidizing gas is one or more gases selected from the group consisting of $O_2$, $O_3$, and $N_xO_y$ (x and y are integers), and the deoxidizing gas is one or more gases selected from the group consisting of $H_2$, $NH_3$, $CH_4$, HCl, D (deuterium), $D_2$, $ND_3$, $CD_4$, and DCl.

6. The method according to claim 1, wherein the exhaust port has an opening area decreased toward a downstream side of exhaust gas flows.

7. The method according to claim 1, wherein the first and second groups of gas spouting holes respectively are in first and second gas distribution nozzles that extend along the process field in a vertical direction.

8. The method according to claim 1, wherein the oxidizing gas is $O_2$ and the deoxidizing gas is $H_2$.

9. An oxidation method for a semiconductor process for oxidizing surfaces of a plurality of target substrates, the method comprising:
   placing the target substrates at intervals in a vertical direction within a process field of a process container;
   supplying an oxidizing gas and a deoxidizing gas to the process field by spouting a gas mixture of the oxidizing gas and the deoxidizing gas only in lateral directions from gas spouting holes disposed adjacent to the target substrates on one side of the process field and arrayed over a length corresponding to the process field in a vertical direction, while exhausting gas through an exhaust port disposed opposite to the gas spouting holes with the process field interposed therebetween and present over a length corresponding to the process field in the vertical direction, to cause the gas mixture of the oxidizing gas and the deoxidizing gas spouted from the gas spouting holes to flow uniformly along the surfaces of the target substrates into the exhaust port while forming gas flows parallel with the target substrates, the gas spouting holes being formed in a sidewall of a mixing chamber configured to mix the oxidizing gas and the deoxidizing gas supplied from gas sources into the mixing chamber to form the gas mixture; and heating the process field by a heater disposed around the process container to activate the oxidizing gas and the deoxidizing gas to cause the oxidizing gas and the deoxidizing gas to react with each other, so as to generate oxygen radicals and hydroxyl group radicals within the process field, while performing an oxidation process on the surfaces of the target substrates by use of the oxygen radicals and the hydroxyl group radicals.

10. The method according to claim 9, wherein the surfaces of the target substrate include a silicon layer to be oxidized in the oxidation process.

11. The method according to claim 9, wherein the oxidation process is performed by use of a process pressure of 50 mTorr to 20 Torr.

12. The method according to claim 9, wherein the oxidation process performed by use of a process temperature of 400 to 1,100° C.

13. The method according to claim 9, wherein the oxidizing gas is one or more gases selected from the group consisting of $O_2$, $O_3$, and $N_xO_y$ (x and y are integers), and the deoxidizing gas is one or more gases selected from the group consisting of $H_2$, $NH_3$, $CH_4$, HCl, D (deuterium), $D_2$, $ND_3$, $CD_4$, and DCl.

14. The method according to claim 9, wherein the exhaust port has an opening area decreased toward a downstream side of exhaust gas flows.

* * * * *